US009841915B1

(12) United States Patent
Lim et al.

(10) Patent No.: US 9,841,915 B1
(45) Date of Patent: Dec. 12, 2017

(54) ELECTRONIC DEVICE

(71) Applicant: SK hynix Inc., Icheon-Si (KR)

(72) Inventors: Jong-Koo Lim, Icheon-si (KR); Guk-Cheon Kim, Yeoju-si (KR); Yang-Kon Kim, Icheon-si (KR); Seung-Mo Noh, Seoul (KR); Ku-Youl Jung, Icheon-si (KR); Won-Joon Choi, Seoul (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/494,331

(22) Filed: Apr. 21, 2017

(30) Foreign Application Priority Data

Sep. 6, 2016 (KR) ........................ 10-2016-0114248

(51) Int. Cl.

| | |
|---|---|
| ***G11C 11/00*** | (2006.01) |
| ***G06F 3/06*** | (2006.01) |
| ***H01L 43/08*** | (2006.01) |
| ***H01L 43/02*** | (2006.01) |
| ***H01L 43/10*** | (2006.01) |
| ***H01L 27/22*** | (2006.01) |
| ***G11C 11/16*** | (2006.01) |
| ***G11C 13/00*** | (2006.01) |
| ***G06F 12/084*** | (2016.01) |

(52) U.S. Cl.

CPC ............ *G06F 3/0625* (2013.01); *G06F 3/065* (2013.01); *G06F 3/0619* (2013.01); *G06F 3/0659* (2013.01); *G06F 3/0685* (2013.01); *G06F 12/084* (2013.01); *G11C 11/1673* (2013.01); *G11C 11/1675* (2013.01); *G11C 13/0004* (2013.01); *H01L 27/224* (2013.01); *H01L 43/02* (2013.01); *H01L 43/08* (2013.01); *H01L 43/10* (2013.01); *G06F 2212/314* (2013.01)

(58) Field of Classification Search

CPC .. G11C 11/00; G11C 11/1673; G11C 11/1675
USPC ........................................................ 365/158
See application file for complete search history.

(56) References Cited

U.S. PATENT DOCUMENTS

2003/0090933 A1* 5/2003 Hidaka .................. G11C 11/16 365/158
2006/0126379 A1* 6/2006 Hidaka .............. G11C 11/1659 365/158

(Continued)

FOREIGN PATENT DOCUMENTS

| | | |
|---|---|---|
| KR | 10-2003-0057522 | 7/2003 |
| KR | 10-1144211 | 5/2012 |
| KR | 10-2015-0057159 | 5/2015 |

*Primary Examiner* — Harry W Byrne
(74) *Attorney, Agent, or Firm* — Perkins Coie LLP

(57) ABSTRACT

This technology provides an electronic device. An electronic device in accordance with an implementation of this document may include a semiconductor memory for storing data, and the semiconductor memory may include a magnetic tunnel junction (MTJ) structure comprising a free layer having a variable magnetization direction, a pinned layer having a pinned magnetization direction, and a tunnel barrier layer interposed between the free layer and the pinned layer; and an under layer located under the MTJ structure, wherein the under layer may include: a first under layer including a silicon-based alloy; a second under layer including a metal; and a blocking layer interposed between the first under layer and the second under layer and including an amorphous material.

20 Claims, 9 Drawing Sheets

(56) References Cited

U.S. PATENT DOCUMENTS

2008/0037315 A1* 2/2008 Hidaka ............... G11C 11/1659 365/158
2011/0096592 A1* 4/2011 Hidaka ............... G11C 11/1659 365/158
2013/0044537 A1* 2/2013 Ishigaki .................. G11C 11/16 365/158
2014/0103469 A1 4/2014 Jan et al.
2015/0070982 A1* 3/2015 Miyakawa ............ G11C 11/161 365/158

* cited by examiner

ELECTRONIC DEVICE

CROSS-REFERENCE TO RELATED APPLICATION

This patent document claims priority of Korean Patent Application No. 10-2016-0114248, entitled "ELECTRONIC DEVICE" and filed on Sep. 6, 2016, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory which can improve characteristics of a variable resistance element.

In one aspect, an electronic device may include a semiconductor memory for storing data, and the semiconductor memory may include a magnetic tunnel junction (MTJ) structure comprising a free layer having a variable magnetization direction, a pinned layer having a pinned magnetization direction, and a tunnel barrier layer interposed between the free layer and the pinned layer; and an under layer located under the MTJ structure, wherein the under layer may include: a first under layer including a silicon-based alloy; a second under layer including a metal; and a blocking layer interposed between the first under layer and the second under layer and including an amorphous material.

Implementations of the above electronic device may include one or more the following.

The first under layer may include SiGe, SiAl, SiB, SiNb, SiZr, SiZn, SiSn or SiAg, or a combination of two or more thereof. The second under layer may include a heavy metal. The second under layer may include Hf, Ta, W, Re, Os, Ir, Pt, Au, Ti, V, Fe, Cr, Mn, Zn, or Ge, or a combination of two or more thereof. The blocking layer may include an amorphous metal material. The blocking layer may include a ferromagnetic material, a non-metallic material, or a non-magnetic metallic material, or a combination of two or more thereof. The first under layer may include SiB, the blocking layer may include FeCoB, and the second under layer may include W. The semiconductor memory may further include a spacer located on a sidewall of the MTJ structure and including silicon oxide. A sidewall of the MTJ structure, a sidewall of the first under layer, a sidewall of the blocking layer and a sidewall of the second under layer may be aligned with one another. A sidewall of the MTJ structure may not be aligned with at least one of a sidewall of the first under layer, a sidewall of the blocking layer or a sidewall of the second under layer. The first under layer may be configured to surround sidewalls and bottom surfaces of the blocking layer and the second under layer. At least a portion of the first under layer may not be covered by the MTJ structure. The semiconductor memory may further include a magnetic correction layer that reduces an effect of a stray magnetic field produced by the pinned layer. The semiconductor memory may further include an intermediate layer interposed between the pinned layer and the magnetic correction layer and including a non-magnetic metal material. The under layer may have a planarized top surface, and the top surface of the under layer may have a width greater than that of a bottom surface of the MTJ structure.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating an electronic device including a semiconductor memory may include: forming a first under layer including a silicon-based alloy over a substrate; forming a blocking layer including an amorphous material over the first under layer; forming a second under layer including a metal over the blocking layer; and forming a magnetic tunnel junction (MTJ) structure over the second under layer to include a free layer having a variable magnetization direction, a pinned layer having a pinned magnetization direction, and a tunnel barrier layer interposed between the free layer and the pinned layer.

Implementations of the above method for fabricating the electronic device may include one or more the following.

The forming of the MTJ structure may include forming the MTJ structure to cover a portion of the first under layer, and forming an initial spacer on a sidewall of the MTJ structure with byproducts including silicon provided from the first under layer. The method may further include, after the forming of the MTJ structure, performing an oxidation process to convert the initial spacer to a final spacer including silicon oxide. The second under layer may include a heavy metal. The blocking layer may include an amorphous metal material. The first under layer may have a thickness greater than that of the second under layer. The method may further include, before the forming of the first under layer: forming an interlayer insulating layer over the substrate; selectively etching the interlayer insulating layer to form a hole that exposes a portion of the substrate; and forming an electrically conductive contact to be filled in a lower portion of the hole, wherein at least a portion of the under layer may be formed in the remaining space of the hole having the electively conductive contact formed in the hole. The MTJ structure may be formed using a single mask, and a sidewall of the MTJ structure may not be aligned with a sidewall of the at least a portion of the under layer formed in the remaining space of the hole. The first under layer may be formed along a bottom surface and a sidewall of the remaining space of the hole, and the blocking layer and the second under layer may be formed such that sidewalls and bottom surfaces thereof are surrounded by the first under layer.

These and other aspects, implementations and associated advantages are described in greater detail in the drawings, the description and the claims.

DETAILED DESCRIPTION

Figure 1:
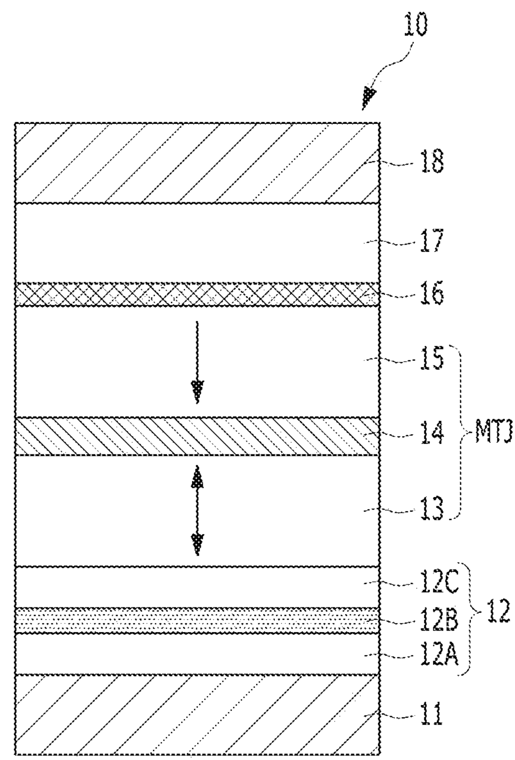
FIG. 1 is a cross-sectional view illustrating an exemplary variable resistance element in accordance with an implementation of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being “on” or “over” a second layer or “on” or “over” a substrate, the first layer may be directly formed on the second layer or the substrate but may also represent a structure where one or more other intermediate layers may exist between the first layer and the second layer or the substrate.

Following implementations of the present disclosure are to provide a semiconductor memory including a variable resistance element having an improved performance and an electronic device including the same. Here, the variable resistance element is capable of being switched between different resistance states in response to the applied bias (for example, a current or voltage). Therefore, the variable resistance element having an improved performance may have an improved switching characteristic between different resistance states.

FIG. 1 is a cross-sectional view illustrating an exemplary variable resistance element in accordance with an implementation of the present disclosure.

Referring to FIG. 1, a variable resistance element 10 according to the implementation of the present disclosure may include a stack of a bottom electrode 11, an under layer 12, a free layer 13, a tunnel barrier layer 14, a pinned layer 15, an intermediate layer 16, a magnetic correction layer 17 and a top electrode 18.

The bottom electrode 11 and the top electrode 18 are located at the bottom and top of the variable resistance element 10, respectively, and may function as terminals to receive a current or voltage that is supplied to the variable resistance element 10. These electrodes may include various electrically conductive materials such as metals, metal nitrides or other suitable materials. Furthermore, the bottom electrode 11 may function as a buffer between the variable resistance element 10 and a constituent element located under the variable resistance element 10. In addition, the top electrode 18 may function as a hard mask in an etching process for forming the variable resistance element 10 while it functions as a buffer between the variable resistance element 10 and a constituent element located above the variable resistance element 10.

In FIG. 1, the variable resistance element 10 includes a magnetic tunnel junction (MTJ) structure that includes the free layer 13, the pinned layer 15 and the tunnel barrier layer 14. The MTJ structure is interposed between the bottom electrode 11 and the top electrode 18. The MTJ structure may further include one or more layers or other structural elements for improving the characteristics of the MTJ structure and its operation and performance, in addition to the free layer 13, the tunnel barrier layer 14 and the pinned layer 15. In some implementations of the MTJ structure, the positions of the free layer 13 and the pinned layer can be reversed. For example, unlike those shown in FIG. 1, the pinned layer 15 may be located under the tunnel barrier layer 14, and the free layer 13 may be located over the tunnel barrier layer 14. Each of the layers forming the MTJ structure will now be explained in further detail.

The free layer 13 has a variable magnetization direction to cause a variable resistance value of the MTJ structure, and thus is capable of storing different data or representing different data bits based on the different relative directions of the magnetization directions of the free layer 13 and the pinned layer 15. The free layer 13 may also be referred as a storage layer. A change in the magnetization direction of the free layer 13 can be induced by spin transfer torque to change the resistance value of the MTJ structure. In this implementation, the magnetization direction of the free layer 13 and the magnetization direction of the pinned layer 15 may be substantially perpendicular to the plane of the free layer 13 and the pinned layer 15 as indicated by the arrows. In other implementations, the magnetization directions of the free layer 13 and the pinned layer 15 may be in the plane of the layers 13 and 15. Thus, in the illustrated example in FIG. 1, the magnetization direction of the free layer 13 is variable between a downward direction and an upward direction and can be changed by the spin transfer torque caused by the spin polarized electrons in a current that is injected through the MTJ structure when the current is above a threshold level. The free layer 13 may have a single-layer or multilayer structure including a ferromagnetic material. For example, the free layer 13 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or other suitable materials, or may include a stack of metals, such as Co/Pt, or Co/Pd.

The tunnel barrier layer 14 allows the tunneling of electrons in both data reading and data writing operations. In a write operation for storing new data, a high write current is directed through the tunnel barrier layer 14 to change the magnetization direction of the free layer 13 and thus to change the resistance state of the MTJ for writing a new data bit. In a reading operation, a low reading current is directed through the tunnel barrier layer 14 without changing the magnetization direction of the free layer 13 to measure the existing resistance state of the MTJ under the existing magnetization direction of the free layer 13 to read the stored data bit in the MTJ. It may include a dielectric oxide, for example, an oxide such as MgO, CaO, SrO, TiO, VO, or NbO.

The pinned layer 15 has a pinned magnetization direction which contrasts with the magnetization direction of the free layer 13, and may be referred to as a reference layer or the like. In this implementation, the magnetization direction of the pinned layer 15 may be substantially perpendicular to the plane or surface of the pinned layer 15 (see the arrow). Thus, as shown in FIG. 1, the magnetization direction of the pinned layer 15 may be pinned in a downward direction. Alternatively, unlike that shown in FIG. 1, the magnetization direction of the pinned layer 15 may be pinned in an upward direction. The pinned layer 15 may have a single-layer or multilayer structure. For example, the pinned layer 15 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy or other suitable materials, or may include a stack of metals, such as Co/Pt, or Co/Pd or others.

The under layer 12 may be located between the MTJ structure and the bottom electrode 11, and may function to improve the characteristics of the MTJ structure. In this implementation, the under layer 12 may include a first under layer 12A including a silicon-based alloy, a second under layer 12C including a metal material, and a blocking layer 12B interposed between the first under layer 12A and the second under layer 12C and including an amorphous material.

In this implementation, perpendicular magnetic anisotropy (PMA) and tunneling magnetoresistance (TMR) can be improved by using the first under layer 12A including a silicon-based alloy and the second under layer 12C including a metal material. However, when the second under layer 12C includes a heavy metal, although PMA properties can be improved, properties of layers located under the second under layer 12C such as a buffer layer may be deteriorated due to diffusion caused by a subsequent heat treatment.

In this context, in this implementation, the first under layer 12A and the second under layer 12C are formed and the blocking layer 12B including an amorphous material is interposed between the first under layer 12A and the second under layer 12C. This structure makes it possible to reduce or prevent metal diffusion from the second under layer 12C to the layers located under the second layer 12C and thus further improve magnetic properties of the MTJ structure.

If the second under layer 12C includes a heavy metal, metal diffusion from the second under layer 12C to the MTJ structure will be not active. Therefore, it is possible to reduce deterioration of the characteristics of the free layer 13 due to the trapping of the metal of the second under layer 12C in the MTJ structure, particularly the free layer 13. Furthermore, if the second under layer 12C including a heavy metal is thin, for example, if it has a thickness smaller than that of the first under layer 12A, metal diffusion can be further hampered.

In this context, in this implementation, the first under layer 12A and the blocking layer 12B are used together with the second under layer 12C. This structure makes it possible to reduce the thickness of the second under layer 12C so as to reduce or prevent metal diffusion from the second under layer 12C and improve a switching current (Ic).

The second under layer 12C may be made of or may include a variety of metal materials depending on its intended use. For example, if the second under layer 12C functions to help a magnetic layer located immediately above the second under layer 12C, for example, the free layer 13, to grow to have a desired crystalline structure, the second under layer 12C has a specific crystalline structure or includes an amorphous metal and comes in direct contact with the bottom surface of the free layer 13. Alternatively, the second under layer 12C may include a metal, for example, tungsten (W) or the like, which increases the tunneling magnetoresistance (TMR) of the MTJ structure.

In some implementations, the second under layer 12C may include a heavy metal. Herein, the heavy metal may be or include Hf, Ta, W, Re, Os, Ir, Pt, Au, Ti, V, Fe, Cr, Mn, Zn, or Ge, or a combination of two or more thereof.

The second under layer 12C may have a thickness of about 0.1 to about 100 Å. In some implementations, the second under layer 12C may have a thickness of about 1 to about 15 Å.

The blocking layer 12B is interposed between the first under layer 12A and the second under layer 12C so as to reduce or prevent metal diffusion of the second under layer 12C and improve magnetic properties and thermal stability of the MTJ structure. Moreover, the blocking layer 12B allows further reducing a thickness of the second under layer 12C including a heavy metal so that a switching current (Ic) can be improved.

The blocking layer 12B may include an amorphous material. The amorphous material may include a ferromagnetic material, a non-metallic material, or a non-magnetic metallic material, or a combination thereof. Moreover, the blocking layer 12B may include an amorphous metal material.

The ferromagnetic material may include, for example, cobalt, nickel, or iron, or a combination thereof. The non-metallic material may include, for example, boron, or nitrogen, or a combination thereof. The non-magnetic metallic material may include Ta, W, Nb, Ti, Cr, Zr, Hf, Mo, Al, Mg, Ru, or V, or a combination thereof.

The blocking layer 12B may have a thickness of about 0.1 to about 100 Å. In some implementations, the blocking layer 12B may have a thickness of about 1 to about 10 Å.

The first under layer 12A is located under the second under layer 12C and the blocking layer 12B. This structure allows to reduce the thickness of the second under layer 12C as compared to the case without the first under layer 12A and the blocking layer 12B. If the first under layer 12A and the blocking layer 12B do not exist, since the under layer 12 is the only layer formed between the MTJ structure and the bottom electrode 11, the second under layer 12C needs to have a sufficient thickness to prevent metal diffusion from the bottom electrode 11 to the MTJ structure. In this implementation, the under layer 12 is formed to include the first under layer 12A and the blocking layer 12B as well as the second under layer 12C and the total thickness of the under layer 12 is the sum of thickness of the first under layer 12B, the blocking layer 12B and the second under layer 12C, the under layer 12C can have a reduced thickness as compared to the case when the under layer 12C includes the second under layer 12C only without the first under layer 12A and the blocking layer 12B. Accordingly, it becomes possible to reduce or prevent metal diffusion from the second under layer 12C since the under layer 12C has a reduced thickness. I.

When the first under layer 12A includes a silicon-based alloy, the silicon of the first under layer 12A can be re-deposited on the sidewall of the variable resistance element 10 in an etching process for forming the variable resistance element 10. This silicon can be easily converted to dielectric silicon oxide in a subsequent oxidation process. Thus, a material that is re-deposited on the sidewall of the variable resistance element 10 in an etching process for forming the variable resistance element 10 can be prevented from acting as a leakage path. The silicon-based alloy that may be used in this implementation may be or include, for example, SiGe, SiAl, SiB, SiNb, SiZr, SiZn, SiSn, or SiAg, or a combination of two or more thereof.

The first under layer 12A may have a thickness of about 0.1 to about 100 Å. In some implementations, the first under layer 12A may have a thickness of about 1 to about 15 Å.

Meanwhile, it was empirically found that, when the first under layer 12A including a silicon-based alloy was located under the second under layer 12C including a metal and the blocking layer 12B was interposed between the first under layer 12A and the second under layer 12C, various characteristics of the MTJ structure can be improved. For example, the perpendicular magnetic anisotropy of the free layer 13 located over the under layer 12 can be improved, and the TMR value and thermal stability of the MTJ structure can be increased. This improvement in characteristics will be described later with reference to FIG. 2.

The magnetic correction layer 17 can function to offset the effect of the stray magnetic field produced by the pinned layer 15. In this case, the effect of the stray magnetic field of the pinned layer 15 on the free layer 13 can decrease, and thus a biased magnetic field in the free layer 13 can decrease. The magnetic correction layer 17 may have a single-layer or multilayer structure including an antiferromagnetic material or a ferromagnetic material. When the magnetic correction layer 17 includes a ferromagnetic material, the magnetic correction layer 17 may have a magnetization direction antiparallel to the magnetization direction of the pinned layer 15. For example, when the pinned layer 15 has a downward magnetization direction as shown in FIG. 1, the magnetic correction layer 17 may have an upward magnetization direction. In this implementation, the magnetic correction layer 17 is located above the pinned layer 15, but the position thereof may be changed, as long as it offsets the effect of the stray magnetic field of the pinned layer 15. For example, the magnetic correction layer 17 may also be located by or below the pinned layer 15 while it is spaced apart from the fixing layer.

The intermediate layer 16 can function as a buffer between the pinned layer 15 and the magnetic correction layer 17 while it can improve the characteristics of the pinned layer 15 and/or the magnetic correction layer 17. The intermediate layer 16 may have a single-layer or multilayer structure including a non-magnetic metal material.

When a voltage or current for a write operation is applied to the bottom electrode 11 and top electrode 18 of the above-described variable resistance element 10, the magnetization direction of the free layer 13 can be changed to a direction parallel or antiparallel to the magnetization direction of the pinned layer 15. Thus, the variable resistance element 10 can switch between a low-resistance state and a high-resistance state to thereby store different data. In this manner, the variable resistance element 10 can function as a memory cell.

Figure 2:
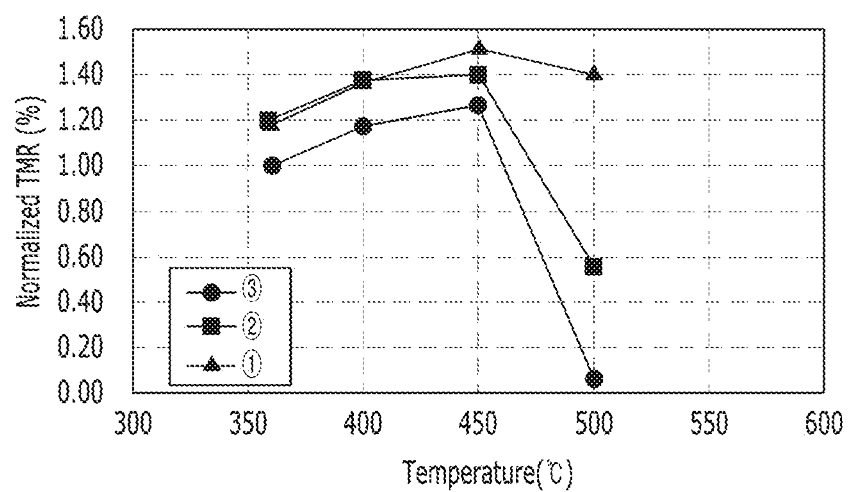
FIG. 2 is a graph illustrating thermal stability of a variable resistance element in accordance with an implementation of the present disclosure and variance resistance elements in accordance with comparative examples.

Hereinafter, the characteristics of a variable resistance element according to an implementation of the disclosed technology will be described in comparison with variable resistance elements of a comparative examples with reference to FIG. 2. In FIG. 2, the variable resistance element according to the implementation of the disclosed technology includes an under layer including a stack of a silicon-based alloy layer, an amorphous material layer and a heavy metal layer. As the implementations of the disclosed technology, the graph ① shows the characteristics of the variable resistance element with a stack of an SiB layer, an FeCoB layer and a W layer. As comparative examples of the variable resistance elements, the graph ② shows the characteristics of the variable resistance element with an under layer configured as a single layer of a silicon-based alloy and the graph ③ shows the characteristics of the variable resistance element with an under layer configured as a single metal layer having wurtzite structure. The variable resistance elements of the present implementation and the comparative examples include a CoFeB layer as a free layer above the under layer.

The graphs of FIG. 2 illustrating thermal stability of the variable resistance element in accordance with an implementation of the present disclosure and the variance resistance elements in accordance with the comparative examples. In FIG. 2, the x-axis indicates the heat treatment temperature of the variable resistance element, and the y-axis indicates the TMR value of the variable resistance element.

Referring to FIG. 2, when the heat treatment temperature of the variable resistance element increases to a specific critical value or higher, for example, 500° C., the TMR value of the variable resistance element decreases, thus deteriorating the characteristics of the variable resistance element. The degree of the decrease in the TMR value is lower in the variable resistance element of the present implementation (see graph ①) than in the variable resistance elements of the comparative examples (see graphs ② and ③). It could be understood from the graphs that the variable resistance element of the present implementation has the thermal stability higher than those of the variable resistance elements of the comparative examples.

As such, when the under layer of the MTJ structure includes a stack of a silicon-based alloy layer, an amorphous material layer and a metal layer, various characteristics of the variable resistance element such as thermal stability, PMA characteristics and Ic can be improved compared to the case in which the under layer includes a single metal layer or a single layer of a silicon-based alloy.

Figure 3A:
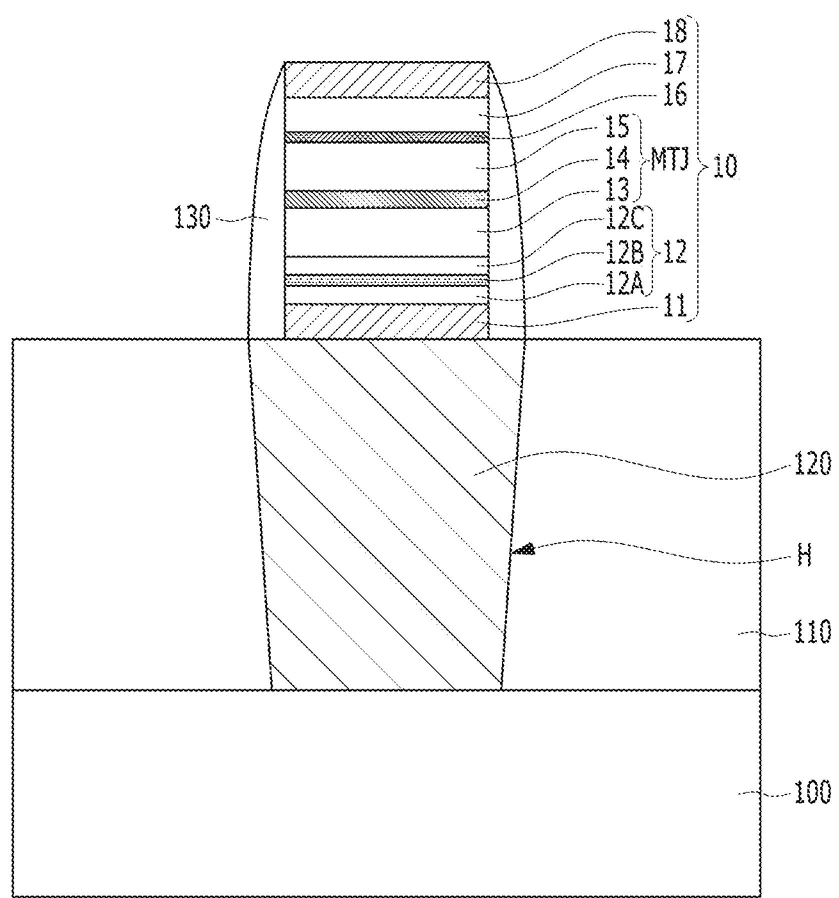
FIGS. 3A and 3B are cross-sectional views for explaining an exemplary semiconductor device and a method for fabricating the same in accordance with an implementation of the present disclosure.
Figure 3B:
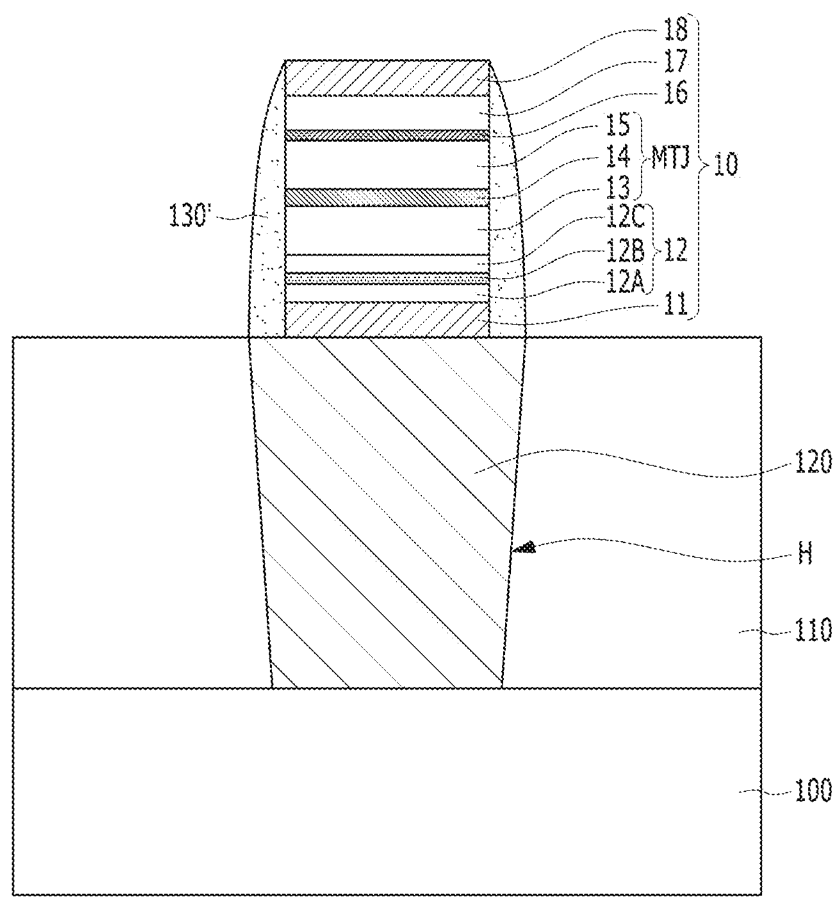

FIGS. 3A and 3B are cross-sectional views illustrating a semiconductor device according to an implementation of the disclosed technology, and a method for fabricating the same. The semiconductor device of this implementation may include one or more variable resistance elements 10 as described above. For example, an array of such variable resistance elements 10 can be used in a semiconductor memory circuit or device.

The method for fabricating the semiconductor device will now be described.

Referring to FIG. 3A, a substrate 100 including a specific required bottom structure (not shown) may be provided. For example, the substrate 100 may include a diode, or a transistor or the like, which operates as a switching element configured to be electrically connected to the lower portion or lower end of the variable resistance element 10 in order to control the supply of a current or a voltage to the variable resistance element 10.

Next, an interlayer insulating layer 110 may be formed on the substrate 100, and then may be selectively etched to form a hole (H) that exposes a portion of the substrate 100, for example, one end of the switching element.

Thereafter, an electrically conductive material may be deposited on the resulting structure including the hole (H), and then a planarization process, for example, a chemical mechanical polishing (CMP) process, may be performed until the top surface of the interlayer insulating layer 110 is exposed, thereby forming an electrically conductive contact 120 filled in the hole (H).

Then, material layers for forming a variable resistance element 10, for example, material layers for forming a bottom electrode, an under layer, an MTJ structure, an intermediate layer, a magnetic correction layer and a top electrode, may be sequentially deposited on the electrically conductive contact 120 and the interlayer insulating layer 110. Then, these material layers may be selectively etched, thereby forming a variable resistance element 10. Byproducts that are produced in this etching process can be attached to the sidewall of the variable resistance element 10 to form an initial spacer 130. Herein, the initial spacer 130 can include silicon that has been used in forming the first under layer 12A. Because the initial spacer 130 is electrically conductive, it can cause a problem that some layers (e.g., a free layer and a pinned layer) which need to be isolated from each other are electrically connected to each other through the sidewall of the variable resistance element 10. To prevent this problem, a process shown in FIG. 3B may be performed.

Referring to FIG. 3B, an oxidation process on the initial spacer 130 may be performed, thereby forming a final spacer 130'. Because the final spacer 130' includes dielectric silicon oxide, it can prevent the free layer and the pinned layer from being electrically connected to each other.

The processes as described above can provide a semiconductor device as shown in FIG. 3B.

Referring to FIG. 3B, the semiconductor device according to the implementation of the disclosed technology may include: the electrically conductive contact 120 on the substrate 100; the variable resistance element 10 which is disposed on the electrically conductive contact 120 and whose bottom end is connected to the electrically conductive contact 120; and the final spacer 130' on the variable resistance element 10.

Herein, the layers forming the variable resistance element 10, for example, the bottom electrode, the under layer, the MTJ structure, the intermediate layer, the magnetic correction layer and the top electrode, may have sidewalls aligned with one another. This is because these layers are etched using a single mask. However, in another implementation, a portion of the variable resistance element 10 and the remaining portion may be patterned in different processes, and thus the sidewall of a portion of the variable resistance element 10 may not be aligned with the sidewall of the remaining portion. This will be described by way of example with reference to FIG. 4.

Figure 4:
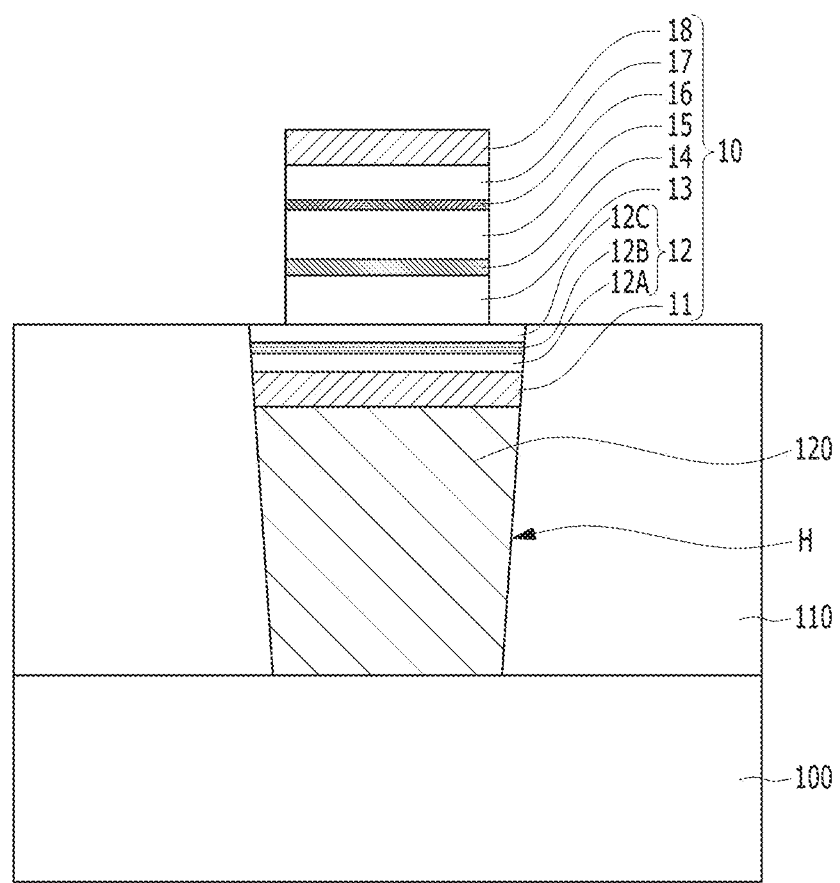
FIG. 4 is a cross-sectional view for explaining an exemplary semiconductor device and a method for fabricating the same in accordance with another implementation of the present disclosure.

FIG. 4 is a cross-sectional view illustrating a semiconductor device according to another implementation of the disclosed technology, and a method for fabricating the same. The following descriptions are mainly provided for the differences of the implementation from FIGS. 3A and 3B.

Referring to FIG. 4, an interlayer insulating layer 110 may be formed on a substrate 100, and then the interlayer insulating layer 110 may be selectively etched to form a hole (H).

Next, an electrically conductive material may be deposited on the resulting substrate including the hole (H), and then etched back to have a desired height, thereby forming an electrically conductive contact 120 that fills the lower portion of the hole (H).

Thereafter, a portion of the variable resistance element 10, for example, a bottom electrode 11 and an under layer 12, may be filled in the remaining space of the hole (H) having the electrically conductive contact 120 formed therein. For example, a material for forming the bottom electrode 11 may be deposited in the hole (H) having the electrically conductive contact 120 formed therein, and then it may be etched back until a desired height is reached. Next, a material for forming the first under layer 12A may be deposited in the hole (H) having the bottom electrode 11 formed therein, and then it may be etched back until a desired height is reached. Next, a material for forming the blocking layer 12B may be deposited in the hole (H) having the first under layer 12A, and then it may be etched back until a desired height is reached. Then, a material for forming the second under layer 12C may be deposited in the hole (H) having the first under layer 12A and the blocking layer 12B, and then a planarization process may be performed until the top surface of the interlayer insulating layer 110 is exposed. As a result, the second under layer 12C may have a planarized top surface.

Next, material layers for forming a free layer 13, a tunnel barrier layer 14, a pinned layer 15, an intermediate layer 16, a magnetic correction layer 17 and a top electrode 18 may be sequentially deposited on the under layer 12 and the interlayer insulating layer 110, and then the material layers may be selectively etched, thereby forming a variable resistance element 10 having the shape shown in FIG. 4.

In this implementation, the bottom electrode 11 and the under layer 12 may be filled in the interlayer insulating layer 110 while they may have sidewalls aligned with the electrically conductive contact 120. The remaining layers of the variable resistance element 10 except the bottom electrode 11 and the under layer 12 may protrude above the interlayer insulating layer 110. The sidewalls of the remaining layers may be aligned with one another but may not be aligned with the sidewalls of the bottom electrode 11 and the under layer 12. In the case in which a portion of the variable resistance element 10 is filled or formed in the hole (H) and patterned as described above prior to the remaining portion of the variable resistance element 10, since the depth to be etched in an etching process for patterning the remaining layers of the variable resistance element 10 decreases, the etching process can be more easily implemented. Hereinafter, for the explanation, the remaining layers of the variable resistance element 10, which protrude above the interlayer insulating layer 110, will be referred to as "the protrusion of the variable resistance element 10".

In some implementations, the width of the top surface of the under layer 12 can be greater than the width of the bottom surface of the protrusion of the variable resistance element 10. Thus, all the protrusion of the variable resistance element 10 can be formed over the under layer 12 having a planarized top surface. In this case, the protrusion of the variable resistance element 10, for example, the tunnel barrier layer 14, can be located above the planarized structure, thus preventing deterioration of the characteristics of the variable resistance element 10. If the tunnel barrier layer 14 is located at the boundary between the interlayer insulating layer 110 and the under layer 12 and is bent, the characteristics of the variable resistance element 10 can be deteriorated.

Meanwhile, although this implementation illustrates that the bottom electrode 11 and the under layer 12 of the variable resistance element 10 are filled in the hole (H), the disclosed technology is not limited thereto and the lower portion of the variable resistance element 10 may be partially filled in the hole (H). For example, the variable resistance element 10 may be configured such that only the bottom electrode 11 is filled in the hole (H) and the remaining portion protrudes above the interlayer insulating layer 110. In some implementations, the variable resistance element 10 may be configured such that the bottom electrode 11 and the first under layer 12A are filled in the hole (H) and the remaining portion protrudes above the interlayer insulating layer 110. If only the bottom electrode 11 is filled in the hole (H) or only the bottom electrode 11 and the first under layer 12A are filled in the hole (H), byproducts including silicon can be attached to the sidewall of the protrusion of the variable resistance element 10 in an etching process for forming the variable resistance element 10. Such byproducts can be converted to silicon oxide in a subsequent oxidation process.

Meanwhile, although the implementation illustrated in FIG. 4 shows that the top surfaces of the first under layer 12A, the blocking layer 12B and the second under layer 12C are parallel to one another, other implementations are also possible. This will be described by way of example with reference to FIG. 5.

Figure 5:
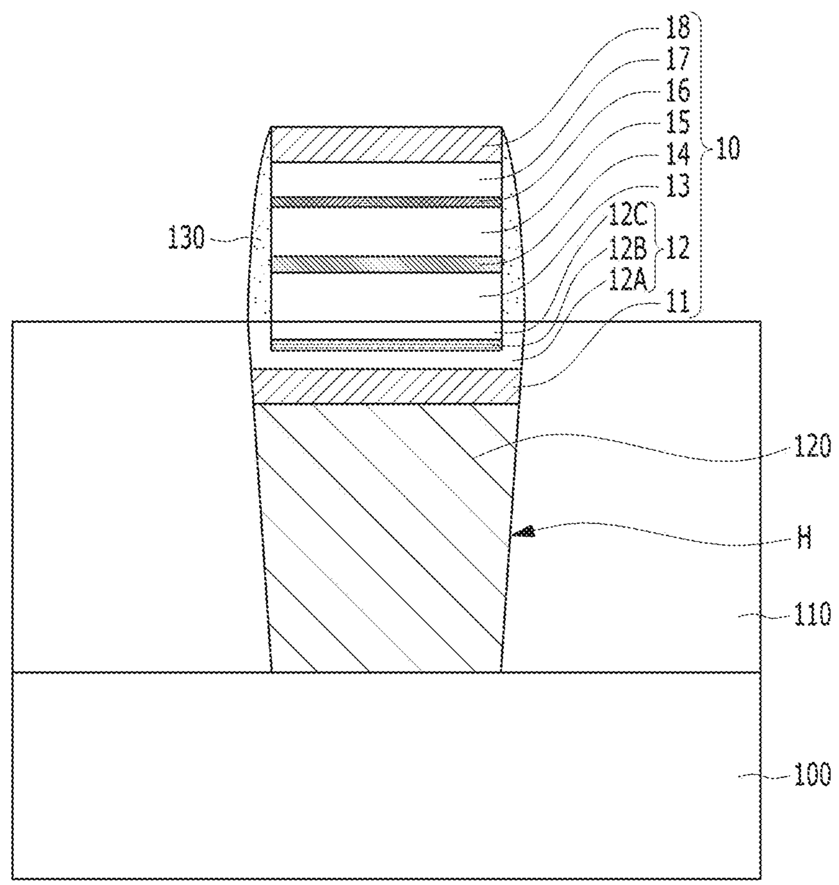
FIG. 5 is a cross-sectional view for explaining an exemplary semiconductor device and a method for fabricating the same in accordance with still another implementation of the present disclosure.

FIG. 5 is a cross-sectional view illustrating a semiconductor device according to still another implementation of the disclosed technology, and a method for fabricating the same. The following descriptions are mainly provided for the differences from FIG. 4.

Referring to FIG. 5, an interlayer insulating layer 110 may be formed on a substrate 100, and then the interlayer insulating layer 110 may be selectively etched to form a hole (H).

Next, an electrically conductive contact 120 and a bottom electrode 11 on the electrically conductive contact 120 may be formed so as to fill the lower portion of the hole (H).

A first under layer 12A may be deposited along the sidewall and bottom side of the remaining space of the hole (H) with the electrically conductive contact 120 and the bottom electrode 11 formed in the hole H.

Next, the blocking layer 12B may be formed on the first under layer 12A to a thickness that partially fills the remaining space of the hole (H) having the first under layer 12A formed therein.

Then, the second under layer 12C may be formed on the blocking layer 12B to a thickness that sufficiently fills the remaining space of the hole (H) having the first under layer 12A and the blocking layer 12B formed therein. Subsequently, a planarization process may be performed until the interlayer insulating layer 110 is exposed.

Next, material layers for forming a free layer 13, a tunnel barrier layer 14, a pinned layer 15, an intermediate layer 16, a magnetic correction layer 17 and a top electrode 18 may be sequentially deposited on the under layer 12 and the interlayer insulating layer 110, and then these material layers may be selectively etched, thereby forming a variable resistance element 10 having a shape as shown in FIG. 5. Herein, when the width of the bottom surface of the protrusion of the variable resistance element 10 is smaller than the width of a region surrounded by the outer sidewall of the first under layer 12A such that the top surface of the first under layer 12A is exposed, an initial spacer (not shown) including silicon can be formed on the sidewall of the protrusion of the variable resistance element 10.

Next, an oxidation process may be performed to thereby form a final spacer 130' including silicon oxide on the sidewall of the protrusion of the variable resistance element 10.

According to this implementation, the first under layer 12A may be configured to surround the sidewalls and bottom surfaces of the blocking layer 12B and the second under layer 12C. The outer sidewall of the first under layer 12A may be aligned with the sidewalls of the bottom electrode 11 and the electrically conductive contact 120. The sidewalls of the layers of the variable resistance element 10 except the bottom electrode 11 and the under layer 12 may be aligned with one another, but may not be aligned with the sidewalls of the bottom electrode 11 and the first under layer 12A.

The above and other memory circuits or semiconductor devices based on the disclosed technology can be used in a range of devices or systems. FIGS. 6-10 provide some examples of devices or systems that can implement the memory circuits disclosed herein. Such a memory circuit may include storage cells such as one or more arrays of storage cells for storing data and each storage cell can include a MTJ structure as disclosed in this document.

Figure 6:
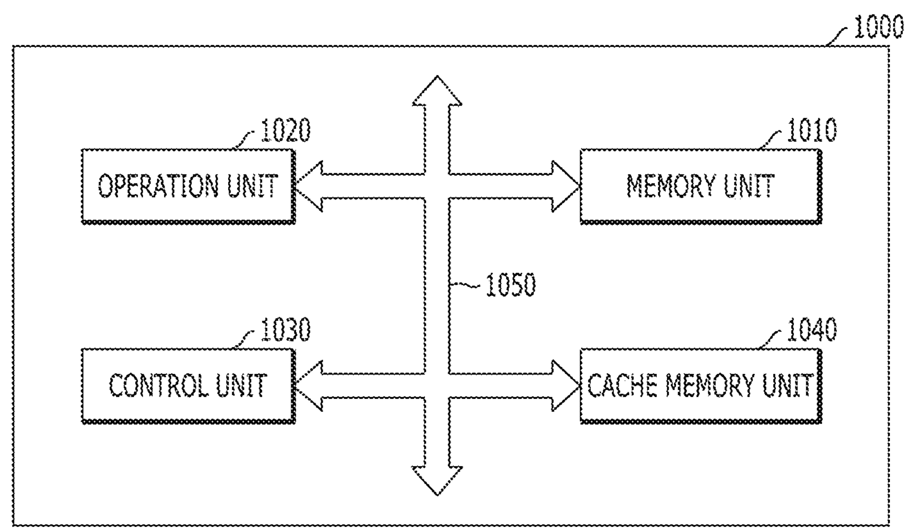
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a magnetic tunnel junction (MTJ) structure comprising a free layer having a variable magnetization direction, a pinned layer having a pinned magnetization direction, and a tunnel barrier layer interposed between the free layer and the pinned layer; and an under layer located under the MTJ structure, wherein the under layer may include: a first under layer including a silicon-based alloy; a second under layer including a metal; and a blocking layer interposed between the first under layer and the second under layer and including an amorphous material. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
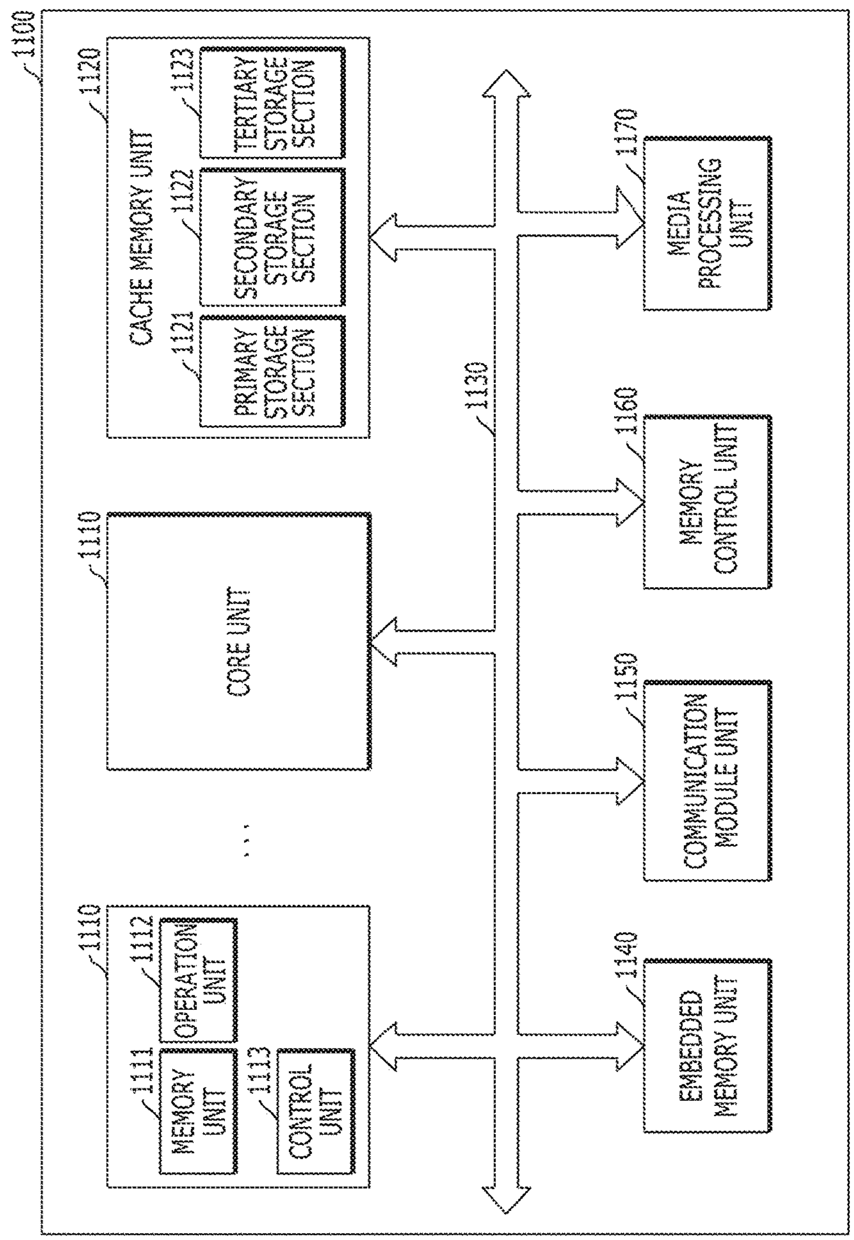
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a magnetic tunnel junction (MTJ) structure comprising a free layer having a variable magnetization direction, a pinned layer having a pinned magnetization direction, and a tunnel barrier layer interposed between the free layer and the pinned layer; and an under layer located under the MTJ structure, wherein the under layer may include: a first under layer including a silicon-based alloy; a second under layer including a metal; and a blocking layer interposed between the first under layer and the second under layer and including an amorphous material. Through this, data storage characteristics of the cache memory unit 1120 may be improved. As a consequence, operating characteristics of the processor 1100 may be improved.

Figure 8:
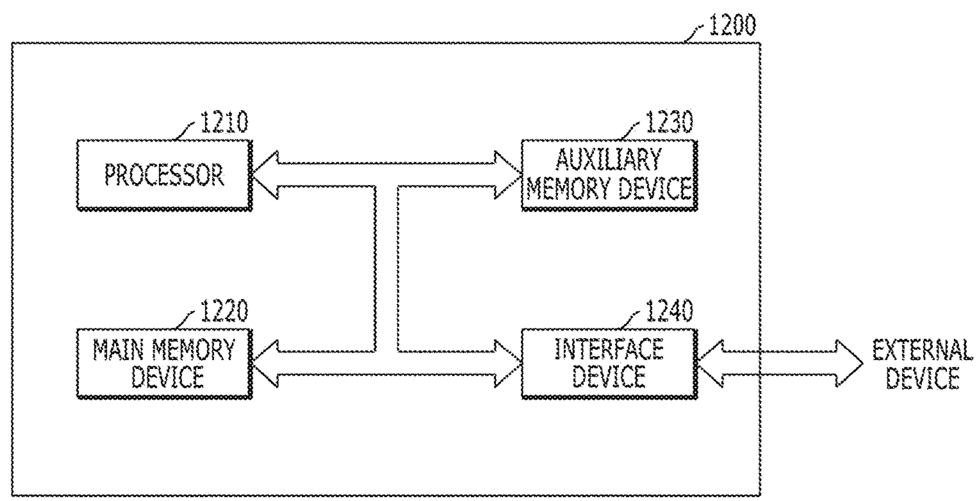
FIG. 8 is an example of configuration diagram of a system implementing memory circuitry based on the disclosed technology.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device.

Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a magnetic tunnel junction (MTJ) structure comprising a free layer having a variable magnetization direction, a pinned layer having a pinned magnetization direction, and a tunnel barrier layer interposed between the free layer and the pinned layer; and an under layer located under the MTJ structure, wherein the under layer may include: a first under layer including a silicon-based alloy; a second under layer including a metal; and a blocking layer interposed between the first under layer and the second under layer and including an amorphous material. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a magnetic tunnel junction (MTJ) structure comprising a free layer having a variable magnetization direction, a pinned layer having a pinned magnetization direction, and a tunnel barrier layer interposed between the free layer and the pinned layer; and an under layer located under the MTJ structure, wherein the under layer may include: a first under layer including a silicon-based alloy; a second under layer including a metal; and a blocking layer interposed between the first under layer and the second under layer and including an amorphous material. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
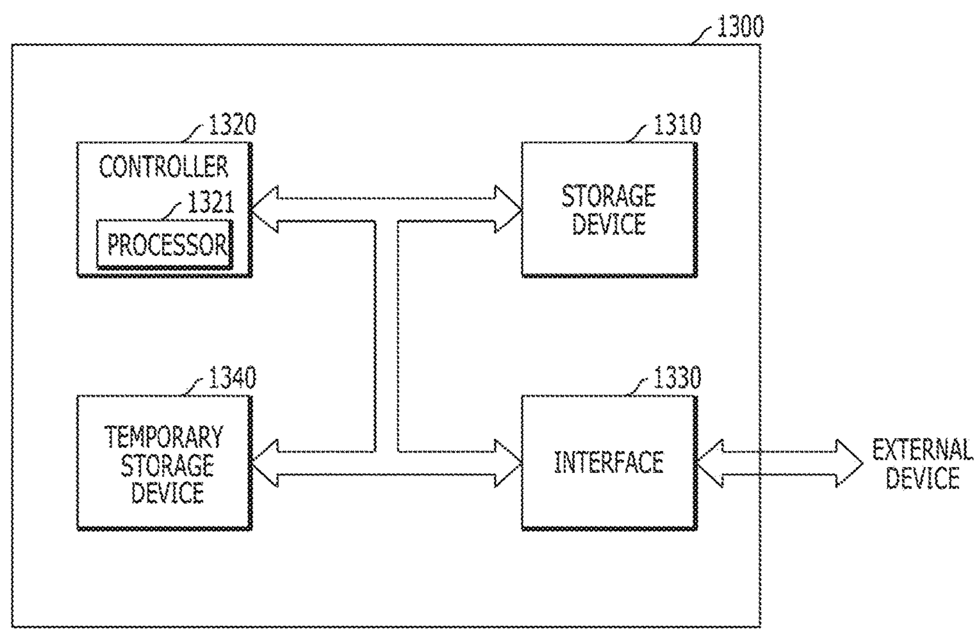
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a magnetic tunnel junction (MTJ) structure comprising a free layer having a variable magnetization direction, a pinned layer having a pinned magnetization direction, and a tunnel barrier layer interposed between the free layer and the pinned layer; and an under layer located under the MTJ structure, wherein the under layer may include: a first under layer including a silicon-based alloy; a second under layer including a metal; and a blocking layer interposed between the first under layer and the second under layer and including an amorphous material. Through this, data storage characteristics of the storage device 1310 or the temporary storage device 1340 may be improved. As a consequence, operating characteristics and data storage characteristics of the data storage system 1300 may be improved.

Figure 10:
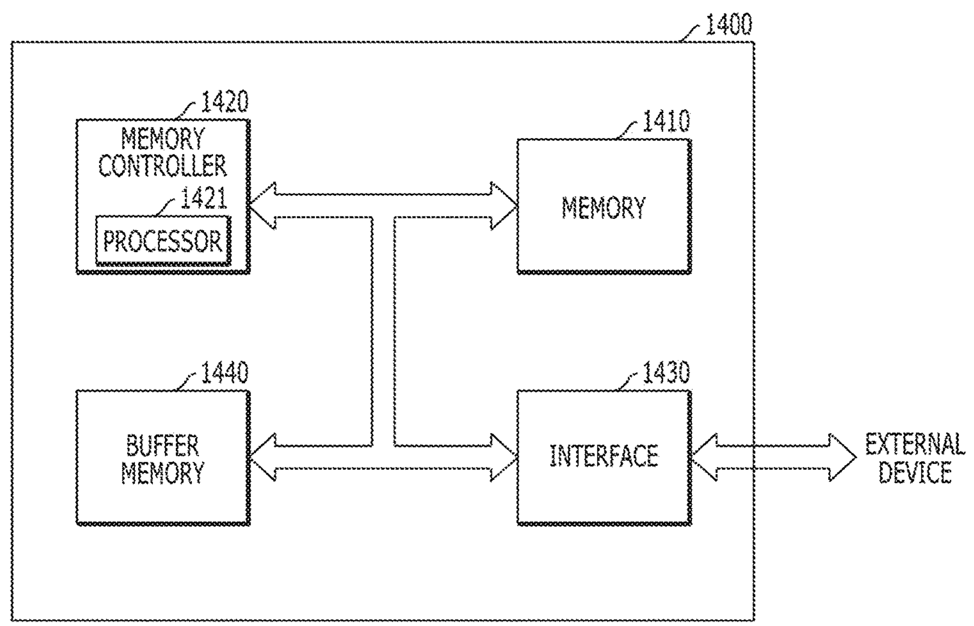
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a magnetic tunnel junction (MTJ) structure comprising a free layer having a variable magnetization direction, a pinned layer having a pinned magnetization direction, and a tunnel barrier layer interposed between the free layer and the pinned layer; and an under layer located under the MTJ structure, wherein the under layer may include: a first under layer including a silicon-based alloy; a second under layer including a metal; and a blocking layer interposed between the first under layer and the second under layer and including an amorphous material. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a magnetic tunnel junction (MTJ) structure comprising a free layer having a variable magnetization direction, a pinned layer having a pinned magnetization direction, and a tunnel barrier layer interposed between the free layer and the pinned layer; and an under layer located under the MTJ structure, wherein the under layer may include: a first under layer including a silicon-based alloy; a second under layer including a metal; and a blocking layer interposed between the first under layer and the second under layer and including an amorphous material. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory for storing data, wherein the semiconductor memory comprises:

a magnetic tunnel junction (MTJ) structure comprising a free layer having a variable magnetization direction, a pinned layer having a pinned magnetization direction, and a tunnel barrier layer interposed between the free layer and the pinned layer; and an under layer located under the MTJ structure, wherein the under layer comprises:

a first under layer including a silicon-based alloy;

a second under layer including a metal; and a blocking layer interposed between the first under layer and the second under layer and including an amorphous material.

2. The electronic device of claim 1, wherein the first under layer comprises SiGe, SiAl, SiB, SiNb, SiZr, SiZn, SiSn or SiAg, or a combination of two or more thereof.

3. The electronic device of claim 1, wherein the second under layer comprises a heavy metal.

4. The electronic device of claim 1, wherein the second under layer comprises Hf, Ta, W, Re, Os, Ir, Pt, Au, Ti, V, Fe, Cr, Mn, Zn, or Ge, or a combination of two or more thereof.

5. The electronic device of claim 1, wherein the blocking layer comprises an amorphous metal material.

6. The electronic device of claim 1, wherein the blocking layer comprises a ferromagnetic material, a non-metallic material, or a non-magnetic metallic material, or a combination of two or more thereof.

7. The electronic device of claim 1, wherein the first under layer comprises SiB, the blocking layer comprises FeCoB, and the second under layer comprises W.

8. The electronic device of claim 1, wherein the semiconductor memory further comprises a spacer located on a sidewall of the MTJ structure and including silicon oxide.

9. The electronic device according to claim 1, wherein a sidewall of the MTJ structure, a sidewall of the first under layer, a sidewall of the blocking layer and a sidewall of the second under layer are aligned with one another.

10. The electronic device according to claim 1, wherein a sidewall of the MTJ structure is not aligned with at least one of a sidewall of the first under layer, a sidewall of the blocking layer or a sidewall of the second under layer.

11. The electronic device according to claim 1, wherein the first under layer is configured to surround sidewalls and bottom surfaces of the blocking layer and the second under layer.

12. The electronic device according to claim 1, wherein at least a portion of the first under layer is not covered by the MTJ structure.

13. The electronic device according to claim 1, wherein the semiconductor memory further comprises a magnetic correction layer that reduces an effect of a stray magnetic field produced by the pinned layer.

14. The electronic device according to claim 13, wherein the semiconductor memory further comprises an intermediate layer interposed between the pinned layer and the magnetic correction layer and including a non-magnetic metal material.

15. The electronic device according to claim 1, wherein the under layer has a planarized top surface, and the top surface of the under layer has a width greater than that of a bottom surface of the MTJ structure.

16. The electronic device according to claim 1, further comprising a microprocessor which includes:

a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

17. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

18. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

19. The electronic device according to claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

20. The electronic device according to claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

* * * * *